United States Patent
Genba et al.

(10) Patent No.: US 9,057,147 B2
(45) Date of Patent: Jun. 16, 2015

(54) SILICON CARBIDE EPITAXIAL SUBSTRATE AND METHOD OF MANUFACTURING SILICON CARBIDE EPITAXIAL SUBSTRATE

(71) Applicant: Sumitomo Electric Industries, Ltd., Osaka-shi (JP)

(72) Inventors: Jun Genba, Itami (JP); Taro Nishiguchi, Itami (JP); Hideyuki Doi, Itami (JP); Akira Matsushima, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/251,328

(22) Filed: Apr. 11, 2014

(65) Prior Publication Data

US 2015/0072100 A1 Mar. 12, 2015

(30) Foreign Application Priority Data

Sep. 6, 2013 (JP) .................................. 2013-185384

(51) Int. Cl.
*C23C 16/00* (2006.01)
*C30B 25/12* (2006.01)
*C30B 29/36* (2006.01)

(52) U.S. Cl.
CPC ................. *C30B 25/12* (2013.01); *C30B 29/36* (2013.01)

(58) Field of Classification Search
CPC ................................ C30B 25/12; C30B 29/36
USPC ................. 427/249.15, 249.1, 248.1
See application file for complete search history.

(56) References Cited

U.S. PATENT DOCUMENTS

2003/0232001 A1* 12/2003 Fujita ........................ 423/445 R
2012/0315767 A1* 12/2012 Sasaki et al. .................. 438/758

FOREIGN PATENT DOCUMENTS

| EP | 0 582 444 A1 * | 7/1993 |
| EP | 582444 A1 * | 2/1994 |
| JP | 2006-028625 A | 2/2006 |
| JP | 2006-232669 A | 9/2006 |
| JP | 2013-121898 A | 6/2013 |
| JP | 2013-170104 A | 9/2013 |

OTHER PUBLICATIONS

Bernd et al. Advances in 4H—SiC Homoepitaxy for Production and Development of Power Devices. Mater. Res. Soc. Symp. Proc. vol. 911 pp. 37-47.*
International Search Report and Written Opinion in PCT International Application No. PCT/JP2014/069681, dated Sep. 9, 2014.

* cited by examiner

*Primary Examiner* — Kelly M Gambetta
(74) *Attorney, Agent, or Firm* — Venable LLP; Michael A. Sartori; Tamatane J. Aga (57) ABSTRACT

A silicon carbide epitaxial substrate having a main surface (second main surface) includes: a base substrate; and a silicon carbide epitaxial layer formed on the base substrate and including the main surface (second main surface), the second main surface having a surface roughness of 0.6 nm or less, a ratio of standard deviation of a nitrogen concentration in the silicon carbide epitaxial layer at a surface layer including the main surface (second main surface) within a plane of the silicon carbide epitaxial substrate to an average value of the nitrogen concentration in the silicon carbide epitaxial layer at the surface layer within the plane of the silicon carbide epitaxial substrate being 15% or less.

6 Claims, 7 Drawing Sheets

SILICON CARBIDE EPITAXIAL SUBSTRATE AND METHOD OF MANUFACTURING SILICON CARBIDE EPITAXIAL SUBSTRATE

BACKGROUND OF THE INVENTION

1. Field of the Invention

The present invention relates to a silicon carbide epitaxial substrate, a method of manufacturing the silicon carbide epitaxial substrate, a method of manufacturing a silicon carbide semiconductor device, a silicon carbide growth device, and a silicon carbide growth device member. In particular, the present invention relates to a silicon carbide epitaxial substrate for a silicon carbide semiconductor device required to have a high breakdown voltage, a method of manufacturing the silicon carbide epitaxial substrate, a method of manufacturing the silicon carbide semiconductor device, a silicon carbide growth device, and a silicon carbide growth device member.

2. Description of the Background Art

Epitaxial growth of a compound semiconductor such as silicon carbide on a substrate needs to be performed by reacting a treatment gas (source material gas or the like) under a high temperature.

Conventionally, in an epitaxial growth device used for epitaxial growth of silicon carbide, a material capable of being inductively heated and having a high heat resistance is employed for members, such as a heat generator and a susceptor, that form a growth chamber. An example of such a material is a carbon material.

Japanese Patent Laying-Open No. 2006-028625 describes a CVD device in which a film member having a high etching resistance for a carrier gas is formed on a susceptor made of a carbon material. Also described therein is a CVD device in which the nitrogen concentration in the film member covering the susceptor is made very low.

However, the inventors of the present application have found that even though the nitrogen concentration in the film member covering the susceptor is made low as described in Japanese Patent Laying-Open No. 2006-028625, it may be difficult to sufficiently reduce the background concentration of nitrogen in a silicon carbide epitaxial layer obtained through epitaxial growth and having good surface quality. It should be noted that the term "background concentration" in the present specification refers to a nitrogen concentration in an epitaxial layer obtained by performing epitaxial growth without using a dopant gas.

Specifically, the inventors of the present application have found that in order to attain good surface quality in a main surface of a silicon carbide epitaxial substrate, it is necessary to perform epitaxial growth under a predetermined growth condition. Also, the inventors of the present application have found that under the above-described growth condition, nitrogen is likely to be captured in the silicon carbide epitaxial substrate and it is difficult to sufficiently reduce the background concentration of nitrogen in the obtained silicon carbide epitaxial layer using the technique of Japanese Patent Laying-Open No. 2006-028625. Moreover, the inventors of the present application have found that the in-plane distribution of the background concentration of nitrogen is large in the main surface of the conventional silicon carbide epitaxial substrate. It has been confirmed that a large in-plane distribution of background concentration in a silicon carbide epitaxial layer will result in a large in-plane distribution of impurity concentration (nitrogen concentration) in the silicon carbide epitaxial layer even when doped with nitrogen as an impurity during epitaxial growth.

The present invention has been made to solve the foregoing problem. The present invention has a main object to provide: a silicon carbide epitaxial substrate having good surface quality and having a sufficiently reduced background concentration of nitrogen; a method of manufacturing such a silicon carbide epitaxial substrate; a method of manufacturing a silicon carbide semiconductor device; and a silicon carbide growth device and a silicon carbide growth device member, each of which allowing for manufacturing of a silicon carbide epitaxial substrate that has good surface quality, that has a sufficiently reduced background concentration of nitrogen, and that has a uniform in-plane distribution of nitrogen concentration.

SUMMARY OF THE INVENTION

A silicon carbide epitaxial substrate according to the present invention is a silicon carbide epitaxial substrate having a main surface, including: a substrate; and a silicon carbide epitaxial layer formed on the substrate and including the main surface, the main surface having a surface roughness (Ra; arithmetic mean roughness) of 0.6 nm or less, a ratio of standard deviation of a nitrogen concentration in the silicon carbide epitaxial layer at a surface layer including the main surface within a plane of the silicon carbide epitaxial substrate to an average value of the nitrogen concentration in the silicon carbide epitaxial layer at the surface layer within the plane of the silicon carbide epitaxial substrate being 15% or less.

According to the present invention, there can be provided a silicon carbide epitaxial substrate that has good surface quality, that has a sufficiently reduced background concentration, and that has a uniform in-plane distribution of nitrogen concentration.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Description of Embodiments of the Invention of the Present Application]

The following describes embodiments of the present invention with reference to figures. It should be noted that in the below-mentioned figures, the same or corresponding portions are given the same reference characters and are not described repeatedly.

Described first is the gist of the embodiments of the present invention.

(1) A silicon carbide epitaxial substrate 10 according to the present embodiment is a silicon carbide epitaxial substrate 10 having a main surface (second main surface 2A), including: a base substrate 1, and a silicon carbide epitaxial layer 2 formed on base substrate 1 and including the main surface (second main surface 2A), second main surface 2A having a surface roughness of 0.6 nm or less, a ratio of standard deviation of a nitrogen concentration in silicon carbide epitaxial layer 2 at a surface layer including the main surface (second main surface 2A) within a plane of silicon carbide epitaxial substrate 10 to an average value of the nitrogen concentration in silicon carbide epitaxial layer 2 at the surface layer including the main surface (second main surface 2A) within the plane of silicon carbide epitaxial substrate 10 being 15% or less in the main surface (second main surface 2A) of silicon carbide epitaxial substrate 10.

Thus, silicon carbide epitaxial substrate 10 according to the present embodiment has the main surface (second main surface 2A) having good surface quality with crystal defects, such as triangle defect and step bunching, being suppressed. Further, in silicon carbide epitaxial substrate 10 according to the present embodiment, the in-plane uniformity of nitrogen concentration in silicon carbide epitaxial layer 2 is high at second main surface 2A (hereinafter, in the present specification, the expression "in-plane uniformity of nitrogen concentration is high" is defined to indicate that the ratio of the standard deviation of the nitrogen concentration in silicon carbide epitaxial layer 2 at the surface layer including second main surface 2A within the plane of silicon carbide epitaxial substrate 10 to the average value of the nitrogen concentration in silicon carbide epitaxial layer 2 at the surface layer including second main surface 2A within the plane of silicon carbide epitaxial substrate 10 is 15% or less). Hence, when manufacturing a silicon carbide semiconductor device using silicon carbide epitaxial substrate 10 according to the present embodiment, there can be obtained a silicon carbide semiconductor device having high in-plane uniformity of property.

(2) In silicon carbide epitaxial substrate 10 according to the present embodiment, a background concentration of the nitrogen in silicon carbide epitaxial layer 2 can be $1 \times 10^{15}$ $cm^{-3}$ or less.

Thus, for example, when silicon carbide epitaxial substrate 10 according to the present embodiment includes silicon carbide epitaxial layer 2 epitaxially grown without using a dopant gas, the nitrogen concentration in silicon carbide epitaxial layer 2 substantially corresponds to the background concentration of nitrogen, whereby the nitrogen concentration can be $1 \times 10^{15}$ $cm^{-3}$ or less. Further, on this occasion, second main surface 2A has a surface roughness of 0.6 nm or less, and the ratio of the standard deviation of the nitrogen concentration in silicon carbide epitaxial layer 2 at the surface layer including the main surface (second main surface 2A) within the plane of silicon carbide epitaxial substrate 10 to the average value of the nitrogen concentration in silicon carbide epitaxial layer 2 at the surface layer including the main surface (second main surface 2A) within the plane of silicon carbide epitaxial substrate 10 is 15% or less in the main surface (second main surface 2A) of silicon carbide epitaxial substrate 10. In other words, silicon carbide epitaxial substrate 10 according to the present embodiment can include silicon carbide epitaxial layer 2 that has good surface quality, that has a very low background concentration of nitrogen, and that has high in-plane uniformity of nitrogen concentration.

(3) In silicon carbide epitaxial substrate 10 according to the present embodiment, the concentration of nitrogen with which silicon carbide epitaxial layer 2 is intentionally doped can be $2 \times 10^{16}$ $cm^{-3}$ or less.

Thus, for example, when silicon carbide epitaxial substrate 10 according to the present embodiment includes silicon carbide epitaxial layer 2 epitaxially grown using a dopant gas, silicon carbide epitaxial layer 2 can contain nitrogen at a concentration of $2 \times 10^{16}$ $cm^{-3}$ or less. Further, on this occasion, second main surface 2A has a surface roughness of 0.6 nm or less, and the ratio of the standard deviation of the nitrogen concentration in silicon carbide epitaxial layer 2 at the surface layer including the main surface (second main surface 2A) within the plane of silicon carbide epitaxial substrate 10 to the average value of the nitrogen concentration in silicon carbide epitaxial layer 2 at the surface layer including the main surface (second main surface 2A) within the plane of silicon carbide epitaxial substrate 10 is 15% or less in the main surface (second main surface 2A) of silicon carbide epitaxial substrate 10. In other words, in silicon carbide epitaxial substrate 10 according to the present embodiment, silicon carbide epitaxial layer 2 has good surface quality, is controlled to have a low background concentration of nitrogen, and has high in-plane uniformity thereof. Accordingly, by manufacturing a silicon carbide semiconductor device using silicon carbide epitaxial substrate 10 according to the present embodiment, fluctuation in property can be suppressed and there can be obtained a silicon carbide semiconductor device particularly suitable for a device required to have a high breakdown voltage.

(4) Silicon carbide epitaxial substrate 10 according to the present embodiment may have an outer diameter of 100 mm or more.

Specifically, even when silicon carbide epitaxial substrate 10 according to the present embodiment has such a large outer diameter of 100 mm or more, silicon carbide epitaxial substrate 10 has good surface quality, is controlled to have a low background concentration of nitrogen, and has high in-plane uniformity thereof. Accordingly, by manufacturing a silicon carbide semiconductor device using silicon carbide epitaxial substrate 10 according to the present embodiment (according to the method of manufacturing the silicon carbide semiconductor device according to the present embodiment), fluctuation in property is suppressed and a silicon carbide semiconductor device 30 particularly suitable for a device required to have a high breakdown voltage can be obtained with high efficiency.

(5) A method of manufacturing a silicon carbide epitaxial substrate according to the present embodiment includes: a step (S11) of preparing a base substrate 1; a step (S12) of placing base substrate 1 in a silicon carbide growth device 100; and a step (S13) of forming a silicon carbide epitaxial layer 2 on base substrate 1 by supplying base substrate 1 with a source material gas used to form silicon carbide epitaxial layer 2 and heating base substrate 1 to an epitaxial growth temperature, silicon carbide growth device 100 including members 11, 12 each exposed to the source material gas and each heated to the epitaxial growth temperature, each of members 11, 12 having a nitrogen concentration of 10 ppm or less.

Thus, in silicon carbide growth device 100 in which the step (S13) of forming silicon carbide epitaxial layer 2 is performed, each of members 11, 12 exposed to the source material gas and heated to the epitaxial growth temperature has a very low nitrogen concentration. Accordingly, by heating to the epitaxial growth temperature in the step (S13), an amount of nitrogen emitted from members 11, 12 into the reaction chamber can be reduced. In other words, silicon carbide epitaxial layer 2 can be epitaxially grown under the condition that the background concentration has been reduced.

As a result of diligent study, the inventors of the present application have found that the epitaxial growth needs to be performed under a predetermined growth condition in order to obtain good surface quality in the main surface of silicon carbide epitaxial substrate 10. Further, the inventors of the present application have found that under the above-described growth condition, nitrogen is likely to be captured in silicon carbide epitaxial substrate 10 and it is difficult to sufficiently reduce the background concentration of nitrogen in obtained silicon carbide epitaxial layer 2 even when the technique of Japanese Patent Laying-Open No. 2006-028625 described above is employed. In other words, it is difficult to sufficiently reduce the nitrogen concentration of silicon carbide epitaxial layer 2 and achieve high in-plane uniformity thereof by only providing the surface regions of members 11, 12 (coating films 11b, 12b among bodies 11a, 12a and coating films 11b, 12b in the case where members 11, 12 include bodies 11a, 12a and coating films 11b, 12b covering the surfaces of bodies 11a, 12a, for example) with a nitrogen concentration of 10 ppm or less. This is presumably because nitrogen is emitted from the inner regions (bodies 11a, 12a, for example) of members 11, 12 via the surface regions of (coating films 11b, 12b, for example) of members 11, 12.

On this occasion, the source material gas supplied to the silicon carbide epitaxial substrate and the gas emitted from members 11, 12 reach the central portion of the substrate via the outer circumferential portion thereof but the silicon carbide epitaxial substrate is in a state in which it is likely to capture nitrogen therein under the above-described growth condition, so that it is considered that an amount of nitrogen captured in the outer circumferential portion of the substrate is more than that in the central portion of the substrate. In fact, it has been confirmed that the background concentration of nitrogen is greatly distributed in the main surface of the silicon carbide epitaxial substrate and the background concentration of nitrogen in the outer circumferential portion is higher than that in the central portion. It should be noted that normally, nitrogen introduced into silicon carbide epitaxial layer 2 without using a dopant gas is active as a carrier as with nitrogen introduced into silicon carbide epitaxial layer 2 as a dopant gas.

Figure 9:
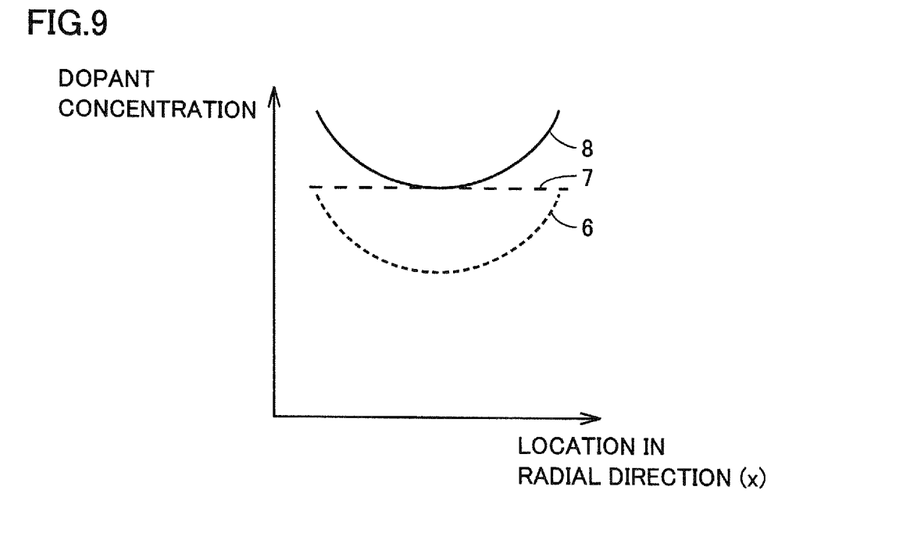
FIG. 9 illustrates a nitrogen concentration distribution in a silicon carbide epitaxial substrate having a high background concentration of nitrogen and having low in-plane uniformity thereof.

An influence of such a background concentration is particularly noticeable when the nitrogen concentration in the case of the intentional doping with the use of the dopant gas is low such as $2 \times 10^{16}$ cm$^{-3}$ or less. In other words, when the nitrogen concentration in the silicon carbide epitaxial layer is very low, a ratio of the background concentration in the nitrogen concentration becomes high. As a result, the nitrogen concentration in the case of the intentional doping with the use of the dopant gas is theoretically supposed to exhibit an in-plane distribution as indicated by a chain line 7 shown in FIG. 9, but is greatly influenced by the in-plane distribution of the background concentration (dotted line 6 shown in FIG. 9), with the result that the nitrogen concentration in the outer circumferential portion of the epitaxial substrate becomes high and therefore the in-plane uniformity (solid line 8 shown in FIG. 9) of the nitrogen concentration (carrier concentration) is decreased in the silicon carbide epitaxial substrate. In other words, the conventional silicon carbide epitaxial substrate having good surface quality and grown under the growth condition providing a nitrogen concentration of $2 \times 10^{16}$ cm$^{-3}$ or less has a high background concentration and has a large in-plane distribution thereof, with the result that the in-plane distribution of the nitrogen concentration becomes large in the silicon carbide epitaxial substrate. Meanwhile, it is considered that if the background concentration can be made low and the in-plane distribution thereof can be made small (dotted line 6 shown in FIG. 10), the in-plane distribution (solid line 8 shown in FIG. 10) of the nitrogen concentration in the silicon carbide epitaxial substrate can be made small.

Figure 10:
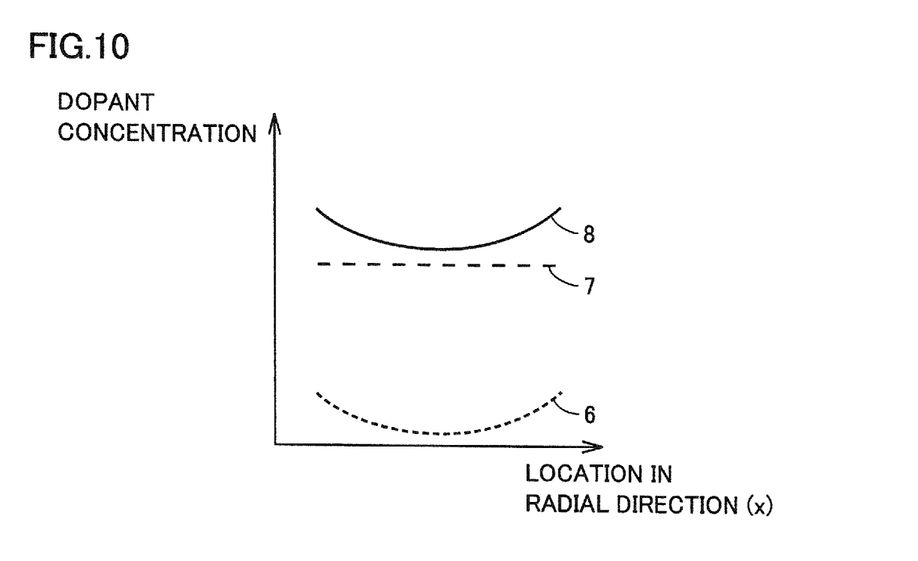
FIG. 10 illustrates a nitrogen concentration distribution in a silicon carbide epitaxial substrate having a low background concentration of nitrogen and having high in-plane uniformity thereof.

The inventors of the present application have found that the in-plane uniformity of the background concentration in second main surface 2A can be improved by setting the nitrogen concentrations of bodies 11a, 12a and coating films 11b, 12b at 10 ppm or less as described above even under the condition for providing silicon carbide epitaxial layer 2 with good surface quality. In other words, according to the method of manufacturing the silicon carbide epitaxial substrate according to the present embodiment, the background concentration can be reduced and the in-plane uniformity of the background concentration in second main surface 2A can be improved. Hence, a silicon carbide epitaxial substrate 10 can be manufactured which includes silicon carbide epitaxial layer 2 having good surface quality and having high in-plane uniformity of nitrogen concentration (as shown in FIG. 10, for example).

(6) In the method of manufacturing the silicon carbide epitaxial substrate, members 11, 12 have bodies 11a, 12a and coating films 11b, 12b covering bodies 11a, 12a, and each of bodies 11a, 12a and coating films 11b, 12b has a nitrogen concentration of 10 ppm or less.

In this way, by heating to the epitaxial growth temperature in the step (S13) of forming silicon carbide epitaxial layer 2, an amount of nitrogen emitted from bodies 11a, 12a and coating films 11.a, 12b into the reaction chamber can be reduced. In other words, silicon carbide epitaxial layer 2 can be epitaxially grown under the condition that the background concentration has been reduced. As a result, a silicon carbide epitaxial substrate 10 can be manufactured which includes silicon carbide epitaxial layer 2 having good surface quality and having high in-plane uniformity of nitrogen concentration.

(7) In the method of manufacturing the silicon carbide epitaxial substrate according to the present embodiment, in the step (S13) of forming silicon carbide epitaxial layer 2, the source material gas may include ammonia ($NH_3$) gas as a dopant gas.

In this way, the in-plane uniformity of the nitrogen concentration in silicon carbide epitaxial layer 2 can be increased more effectively. Specifically, the ammonia gas, which is thermally decomposed at a temperature lower than the temperature of thermal decomposition of the nitrogen gas, can be sufficiently thermally decomposed at a general growth temperature (approximately 1400° C. to 1700° C. as described above) for forming silicon carbide epitaxial layer 2, so that the in-plane uniformity of the nitrogen concentration can be increased.

(8) In the method of manufacturing the silicon carbide epitaxial substrate according to the present embodiment, base substrate 1 prepared in the step (S11) of preparing base substrate 1 may have an outer diameter of 100 mm or more.

When base substrate 1 has a small diameter such as less than 100 mm, in the step of forming silicon carbide epitaxial layer 2, the nitrogen gas emitted from the members (members 11, 12) around base substrate 1 reaches the central portion of silicon carbide epitaxial substrate 10 from the outer circumferential portion thereof and is uniformly mixed therein. Meanwhile, when base substrate 1 has a large diameter such as 100 mm or more, the nitrogen gas emitted from the members (members 11, 12) around base substrate 1 is captured in the outer circumferential portion of silicon carbide epitaxial substrate 10, with the result that the amount of mixed nitrogen gas is decreased in the central portion. Accordingly, the nitrogen concentration in the outer circumferential portion of silicon carbide epitaxial substrate 10 becomes higher than that in the central portion, with the result that the in-plane distribution of nitrogen concentration becomes large.

However, even when base substrate 1 has a large diameter, the method of manufacturing the silicon carbide epitaxial substrate according to the present embodiment can provide improved in-plane uniformity of background concentration in second main surface 2A. Hence, silicon carbide epitaxial substrate 10 can be manufactured which includes silicon carbide epitaxial layer 2 having good surface quality and high in-plane uniformity of the nitrogen concentration. In other words, the method of manufacturing the silicon carbide epitaxial substrate according to the present embodiment can provide a noticeable effect in a substrate having a large outer diameter, particularly, 100 mm or more.

(9) A method of manufacturing a silicon carbide semiconductor device according to the present embodiment includes a step (S10) of preparing a silicon carbide epitaxial substrate 10; and a step (S20) of forming electrodes 91, 92 on silicon carbide epitaxial substrate 10, in the step (S10) of preparing silicon carbide epitaxial substrate 10, silicon carbide epitaxial substrate 10 being manufactured using the method of manufacturing the silicon carbide epitaxial substrate as recited in the above-described item (5).

As described above, silicon carbide epitaxial substrate 10 manufactured through the method of manufacturing the silicon carbide epitaxial substrate according to the present embodiment includes silicon carbide epitaxial layer 2 having good surface quality and high in-plane uniformity of nitrogen concentration. Accordingly, by manufacturing a silicon carbide semiconductor device 30 using silicon carbide epitaxial substrate 10, fluctuation in property can be suppressed and a silicon carbide semiconductor device 30 particularly suitable for a device required to have a high breakdown voltage can be obtained with high efficiency.

(10) A silicon carbide growth device 100 according to the present embodiment includes members 11, 12 each exposed to a source material gas used to epitaxially grow silicon carbide and each heated to an epitaxial growth temperature, each of members 11, 12 having a nitrogen concentration of 10 ppm or less.

Members 11, 12 in silicon carbide growth device 100 according to the present embodiment are members exposed to the source material gas for epitaxial growth of silicon carbide and heated to the epitaxial growth temperature. When viewed from a different view point, members 11, 12 are members placed under a condition similar to that for base substrate 1 in silicon carbide growth device 100.

When each of members 11, 12 has a nitrogen concentration not sufficiently low (such as more than 10 ppm), a large amount of nitrogen is emitted from members 11, 12 heated to the epitaxial growth temperature and the nitrogen thus emitted is supplied onto first main surface 1A of base substrate 1 together with the source material gas. On this occasion, under the epitaxial growth condition for obtaining silicon carbide epitaxial substrate 10 having good surface quality, the nitrogen is readily captured in silicon carbide epitaxial layer 2. Accordingly, a high concentration of nitrogen is captured in the outermost region of silicon carbide epitaxial substrate 10 when silicon carbide epitaxial substrate 10 rotates, and is captured in a region of silicon carbide epitaxial substrate 10 at the upstream side in the flow direction of the source material gas when silicon carbide epitaxial substrate 10 does not rotate, for example. As a result, even when nitrogen is not actively added (even when no dopant gas is provided), the in-plane uniformity of the nitrogen concentration of silicon carbide epitaxial layer 2 becomes low.

Further, when nitrogen is actively added and a silicon carbide epitaxial layer having a low nitrogen concentration is grown, the nitrogen emitted from members 11, 12 described above influences to result in low in-plane uniformity of background concentration. Thus, it is difficult to increase the in-plane uniformity of nitrogen concentration. Meanwhile, the amount of nitrogen emitted from members 11, 12 is generally changed with passage of time (the amount of emitted nitrogen is decreased depending on frequency of use thereof or the like). This makes it difficult to control the nitrogen concentration to a predetermined value in the region in which the nitrogen is captured, for example, in the outermost region of silicon carbide epitaxial substrate 10. This is particularly noticeable when the ratio of the nitrogen emitted from members 11, 12 is relatively high in the nitrogen concentration in silicon carbide epitaxial layer 2 (when silicon carbide epitaxial layer 2 is formed to have a low nitrogen concentration such as $2 \times 10^{16}$ or less).

According to the method of manufacturing the silicon carbide epitaxial substrate according to the present embodiment, each of members 11, 12 has a nitrogen concentration of 10 ppm or less. As a result, the amount of nitrogen emitted from each of members 11, 12 can be sufficiently reduced. Accordingly, even when forming a silicon carbide epitaxial layer 2 having a very low nitrogen concentration, silicon carbide epitaxial layer 2 can be formed to have good surface quality and high in-plane uniformity of nitrogen concentration.

It should be noted that members 11, 12 may include: bodies 11a, 12a; and coating films 11b, 12b covering bodies 11a, 12a. In this case, the nitrogen concentration of each of bodies 11a, 12a and coating films 11b, 12b may be 10 ppm or less. Also in this case, the amount of nitrogen emitted from each of bodies 11a, 12a and coating films 11b, 12b can be sufficiently reduced. Accordingly, even when forming a silicon carbide epitaxial layer 2 having a very low nitrogen concentration, silicon carbide epitaxial layer 2 can be formed to have good surface quality and high in-plane uniformity of nitrogen concentration.

(11) In a silicon carbide growth device 100, each of silicon carbide growth device members 11, 12 according to the present embodiment is a member that is exposed to a source material gas used to epitaxially grow silicon carbide and that is heated to an epitaxial growth temperature, and has a nitrogen concentration of 10 ppm or less.

Thus, the nitrogen concentration is suppressed to be sufficiently low in each of silicon carbide growth device members 11, 12 according to the present embodiment. Hence, even when heated to the epitaxial growth temperature, the amount of nitrogen emitted from members 11, 12 can be sufficiently made small for the in-plane uniformity of nitrogen concentration in silicon carbide epitaxial layer 2. As a result, the in-plane uniformity of nitrogen concentration in silicon carbide epitaxial layer 2 can be sufficiently increased even when the nitrogen concentration in silicon carbide epitaxial layer 2 is very low such as $2.0\times10^{16}$ cm$^{-3}$ or less, for example.

It should be noted that silicon carbide growth device members 11, 12 may include: bodies 11a, 12a; and coating films 11b, 12b covering bodies 11a, 12a. In this case, the nitrogen concentration of each of bodies 11a, 12a and coating films 11b, 12b may be 10 ppm or less. Also in this case, the amount of nitrogen emitted from members 11, 12 can be sufficiently made small for the in-plane uniformity of nitrogen concentration in silicon carbide epitaxial layer 2.

[Details of Embodiments of the Invention of the Present Application]

The following describes details of the embodiments of the present invention.

(First Embodiment)

Figure 1:
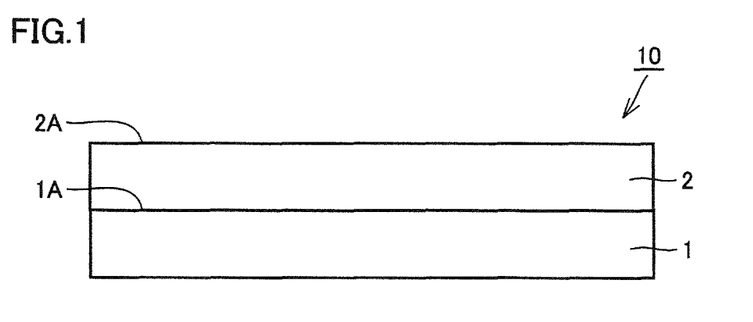
FIG. 1 is a cross sectional view for illustrating a silicon carbide epitaxial substrate according to a first embodiment.

Referring to FIG. 1, a silicon carbide epitaxial substrate 10 according to a first embodiment will be described. Silicon carbide epitaxial substrate 10 according to the present embodiment includes a base substrate 1, and a silicon carbide epitaxial layer 2 formed on a first main surface 1A of base substrate 1.

Base substrate 1 is made of single-crystal silicon carbide, and has first main surface 1A having an outer diameter of 100 mm or more, for example. The silicon carbide of base substrate 1 has a hexagonal crystal structure, preferably, has a crystal polymorphism (polytype) of 4H-SiC, for example. Base substrate 1, which contains an n type impurity such as nitrogen (N) at a high concentration, has n type conductivity. The impurity concentration of base substrate 1 is approximately not less than $1.0\times10^{18}$ cm$^{-3}$ and not more than $1.0\times10^{19}$ cm$^{-3}$, for example. First main surface 1A may correspond to a {0001} plane, or may correspond to a plane having an off angle of 10° or less relative to the {0001} plane, for example. Base substrate 1 has a thickness of, for example, approximately not less than 200 μm and not more than 700 μm.

Silicon carbide epitaxial layer 2 is a layer made of silicon carbide and formed through epitaxial growth on first main surface 1A of base substrate 1, and has a second main surface 2A. Second main surface 2A has a surface roughness (Ra) of 0.6 nm or less, preferably 0.4 nm or less, more preferably 0.2 nm or less. Here, the surface roughness (Ra) of second main surface 2A can be measured using an atomic force microscope (AFM), for example. In second main surface 2A, growth conditions such as C/Si ratio and growth temperature are adjusted so as to suppress formation of step bunching and triangle defect.

Silicon carbide epitaxial layer 2, which contains an n type impurity such as nitrogen (N), has n type conductivity. Silicon carbide epitaxial layer 2 may have an impurity concentration lower than that of base substrate 1. The impurity concentration (nitrogen concentration) of silicon carbide epitaxial layer 2 when not doped intentionally is $1.0\times10^{15}$ cm$^{-3}$ or less, for example. The impurity concentration of silicon carbide epitaxial layer 2 when doped intentionally is $2\times10^{16}$ cm$^{-3}$ or less.

In-plane uniformity (σ/Ave.) of nitrogen concentration in silicon carbide epitaxial layer 2 at a surface layer including second main surface 2A is 15% or less, preferably 10% or less, more preferably 5% or less. Here, the in-plane uniformity is represented by standard deviation (σ) and average value (Ave.) of nitrogen concentrations measured at a predetermined interval (for example, at nine points of measurement) in the radial direction. In other words, the nitrogen concentration in silicon carbide epitaxial layer 2 is very low and the in-plane uniformity thereof is high. Silicon carbide epitaxial layer 2 has a film thickness of approximately not less than 5 μm and not more than 40 μm, for example.

Figure 2:
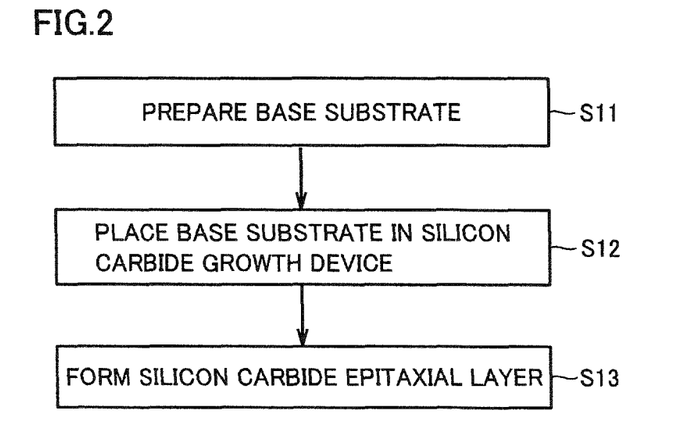
FIG. 2 is a flowchart of a method of manufacturing the silicon carbide epitaxial substrate according to the first embodiment.

Referring to FIG. 2, the following describes a method of manufacturing the silicon carbide epitaxial substrate according to the present embodiment. The method of manufacturing the silicon carbide epitaxial substrate according to the present embodiment includes: a step (S11) of preparing base substrate 1; a step (S12) of placing base substrate 1 in a silicon carbide growth device 100 (see FIG. 3); and a step (S13) of forming silicon carbide epitaxial layer 2 on base substrate 1 by supplying base substrate 1 with a source material gas used to form silicon carbide epitaxial layer 2, and heating base substrate 1 to an epitaxial growth temperature.

First, base substrate 1 is prepared which has first main surface 1A having an outer diameter of, for example, 100 mm and which is made of single-crystal silicon carbide (step (S11)). Such a base substrate 1 having an outer diameter of 100 mm may be prepared using any method. It should be noted that base substrate 1 may have an outer diameter of 5 inches or more (such as 6 inches) (here, one inch equals 25.4 mm).

Next, base substrate 1 is placed in silicon carbide growth device 100 (step (S12)). As one example, silicon carbide growth device 100 according to the present embodiment is a CVD (Chemical Vapor Deposition) device 100.

Figure 3:
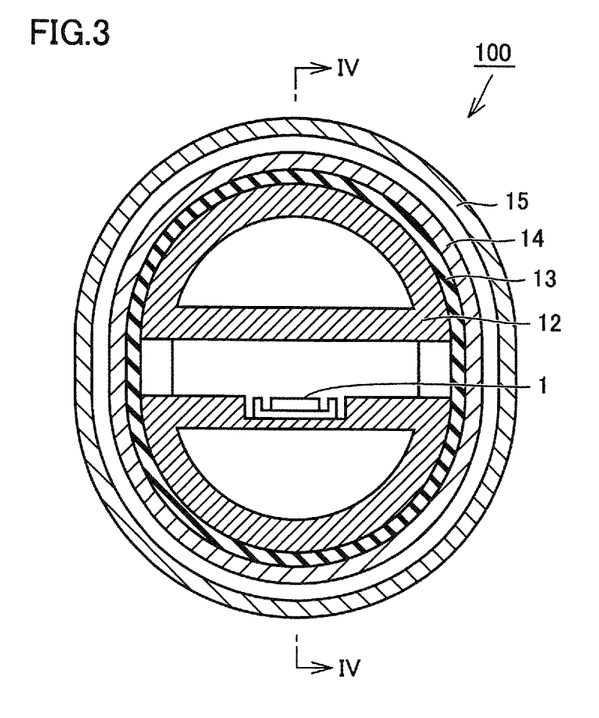
FIG. 3 is a cross sectional view for illustrating a silicon carbide growth device according to the first embodiment.
Figure 4:
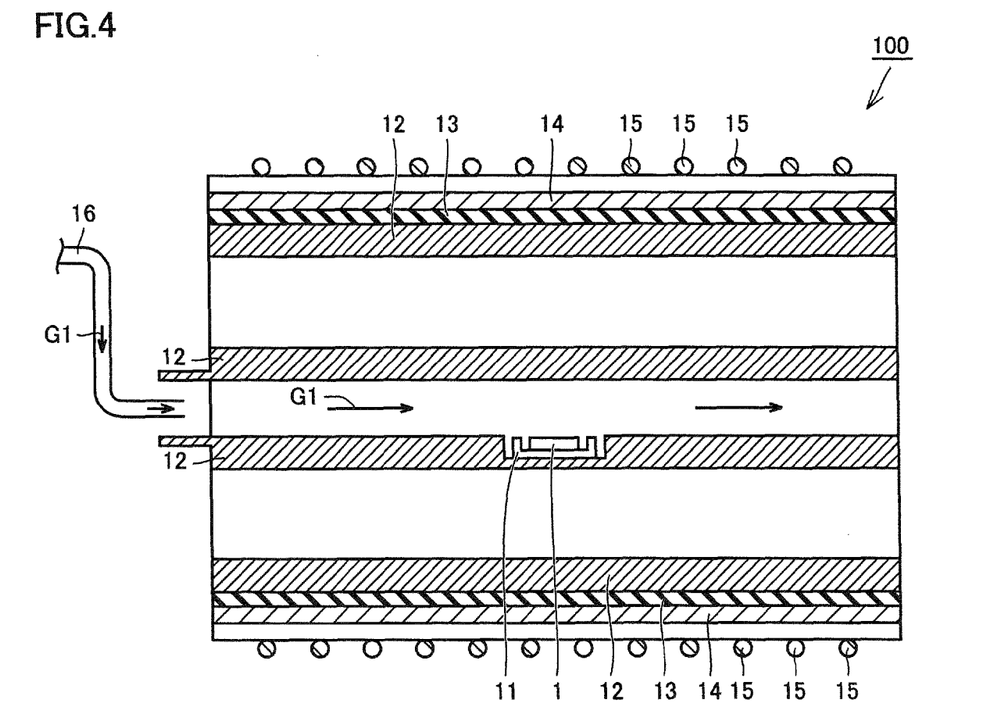
FIG. 4 is a cross sectional view taken along a line IV-IV in FIG. 3.

Referring to FIG. 3 and FIG. 4, in CVD device 100, base substrate 1 is placed on a substrate holder 11. Substrate holder 11 is surrounded by heat generators 12, a heat insulating member 13, a quartz tube 14, and an induction heating coil 15. Specifically, substrate holder 11 is disposed in a recess formed in heat generator 12, for example. Substrate holder 11 is provided such that it is rotatable when disposed on a heat generator 12. Heat generator 12 has a semi-cylindrical hollow structure, and has a curved surface following the circular arc and a flat surface. In CVD device 100, two heat generators 12 are disposed such that their flat surfaces face each other, thereby forming a reaction chamber surrounded by the flat surfaces of heat generators 12. The recess is provided in the flat surface of one of heat generators 12 forming the reaction chamber.

Heat insulating member 13 is disposed to surround the outer circumferences of heat generators 12. Quartz tube 14 is disposed to surround the outer circumferential side of heat insulating member 13. Induction heating coil 15 includes a plurality of coil members, and is provided to be wound around the outer circumferential side of quartz tube 14, for example. When induction heating coil 15 is configured as a high frequency coil and is fed with a high frequency current, heat generators 12 are inductively heated by electromagnetic induction action. Accordingly, base substrate 1, the source material gas supplied to base substrate 1, and the like can be heated to a predetermined temperature.

Figure 6:
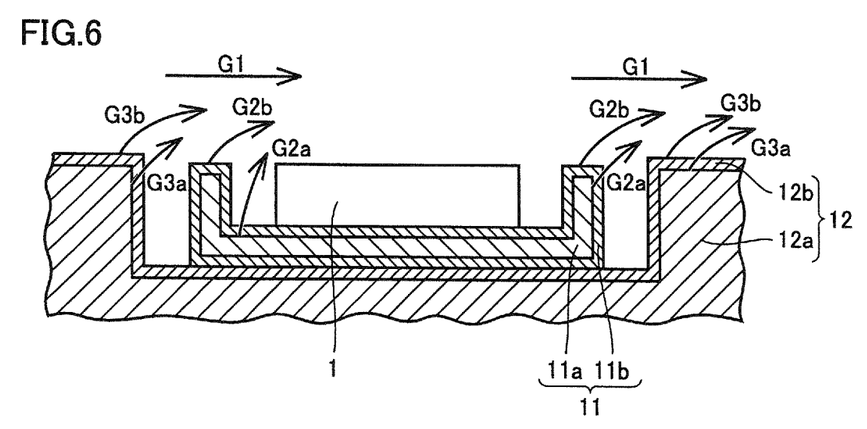
FIG. 6 is a cross sectional view showing the configuration around the substrate holder in the silicon carbide growth device shown in FIG. 5 according to the first embodiment.

Here, substrate holder 11 and heat generator 12 are electrically conductive members each having a high heat resistance, and are constructed of members each having a very low nitrogen concentration. Specifically, as shown in FIG. 6, substrate holder 11 includes: a substrate holder body 11a; and a holder coating portion 11b covering substrate holder body 11a. Further, heat generator 12 includes a heat generator body 12a and a heat generator coating portion 12b covering heat generator body 12a.

Each of substrate holder body 11a and heat generator body 12a is made of a carbon material, for example. The carbon material of each of substrate holder body 11a and heat generator body 12a has a nitrogen concentration of 10 ppm or less, preferably, 5 ppm or less.

Each of holder coating portion 11b and heat generator coating portion 12b is made of SiC, TaC, or the like, for example. The SiC or TaC of holder coating portion 11b and heat generator coating portion 12b has a nitrogen concentration of 10 ppm or less, preferably, 5 ppm or less. It should be noted that each of substrate holder 11 and heat generator 12 serves as a silicon carbide growth device member according to the present embodiment.

Next, silicon carbide epitaxial layer 2 is formed on first main surface 1A of base substrate 1 (step (S13)). Specifically, in CVD device 100, by supplying base substrate 1 with the source material gas used to form silicon carbide epitaxial layer 2 and heating base substrate 1 to the epitaxial growth temperature, silicon carbide epitaxial layer 2 is formed on first main surface 1A of base substrate 1. As shown in FIG. 4, the source material gas is introduced into CVD device 100 via a pipe 16. The source material gas includes monosilane ($SiH_4$), propane ($C_3H_8$), ammonia ($NH_3$), and the like. In addition to the source material gas, a carrier gas including hydrogen ($H_2$) is introduced. In doing so, each of the gases is introduced into the reaction chamber such that it is sufficiently thermally decomposed when supplied onto first main surface 1A of base substrate 1.

Particularly, the ammonia gas, which is used as a dopant gas, of the source material gas is preferably thermally decomposed in advance by preheating the ammonia gas before supplying it onto base substrate 1. The ammonia gas thus preheated and therefore securely thermally decomposed is supplied onto base substrate 1. Accordingly, in the step of forming silicon carbide epitaxial layer 2, distribution of the nitrogen gas can be uniform in first main surface 1A of base substrate 1 on which the epitaxial growth is being performed as well as in second main surface 2A of silicon carbide epitaxial layer 2. This leads to increased uniformity of concentration distribution of nitrogen with which silicon carbide epitaxial layer 2 is doped.

Figure 11:
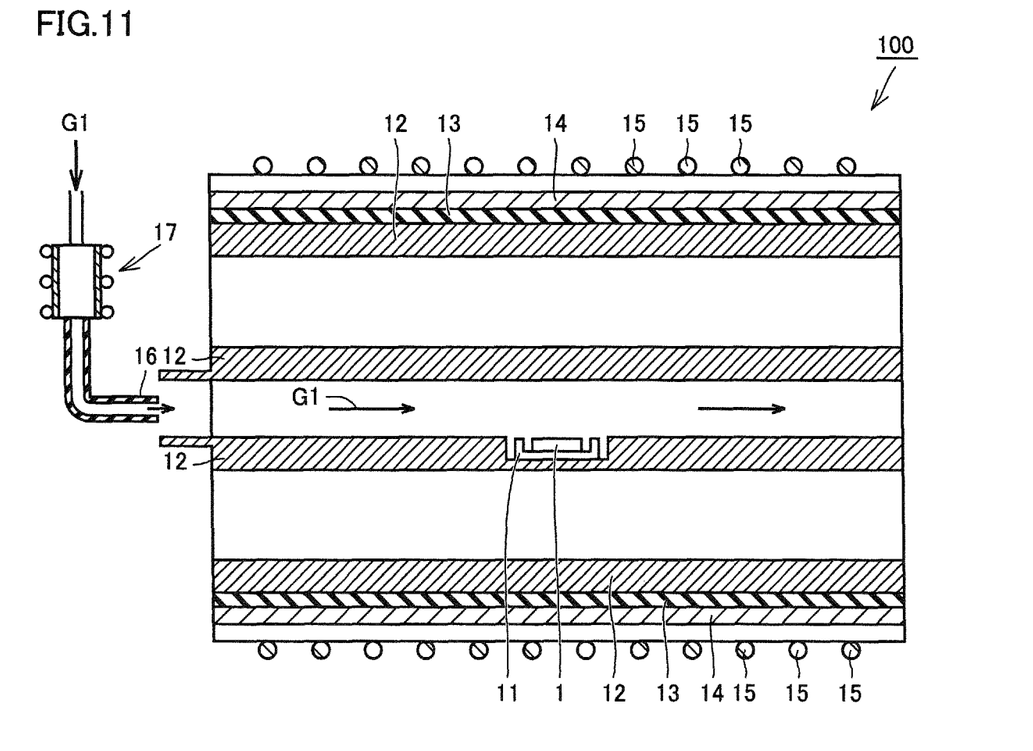
FIG. 11 is a cross sectional view showing a modification of a silicon carbide growth device according to the first embodiment.

Referring to FIG. 11, the preheating for the ammonia gas is performed using a preheating structure 17 attached to pipe 16 for introducing the source material gas to CVD device 100, for example. Preheating structure 17 has a room heated to 1300° C. or more. By letting the ammonia gas flow through preheating structure 17 and then supplying it to CVD device 100, the ammonia gas can be sufficiently thermally decomposed without causing a large disturbance in the gas flow.

Here, the term "room" provided in preheating structure 17 is intended to mean a space for heating the flowing gas, and encompass: an externally heated elongated pipe; a room having a heat transfer coil provided therein; a wide space having an inner wall surface provided with a fin or the like; and so on. It should be noted that the upper limit of the temperature of the wall surface of the room is preferably 1350° C. or more in order to ensure the thermal decomposition even when the room has a slightly short length, and is preferably 1600° C. or less in view of thermal efficiency. It should be noted that preheating structure 17 may be separated from or incorporated in the reaction container as long as the ammonia gas is sufficiently thermally decomposed without disturbing the flow until the ammonia gas reaches base substrate 1 on which the epitaxial growth is performed. Further, all the gases of the source material gas may be preheated together or only the ammonia gas may be preheated and then may be mixed with the other gases of the source material gas.

Further, the gases may be mixed with each other before being introduced into the reaction chamber of CVD device 100, or may be mixed with each other in the reaction chamber of CVD device 100.

While heating base substrate 1 placed on substrate holder 11, base substrate 1 is supplied with the carrier gas and the source material gas, thereby forming silicon carbide epitaxial layer 2, which is an epitaxial growth layer doped with nitrogen (N) atoms, on first main surface 1A. Specifically, silicon carbide epitaxial layer 2 is formed under conditions that the growth temperature is not less than 1500° C. and not more than 1750° C. and the pressure is not less than $1\times10^3$ Pa and not more than $3\times10^4$ Pa. In doing so, by adjusting the flow rate of the $NH_3$ gas, silicon carbide epitaxial layer 2 is provided with an n type impurity concentration of approximately not less than $1\times10^{15}$ cm$^{-3}$ and not more than $2\times10^{16}$ cm$^{-3}$. Further, silicon carbide epitaxial layer 2 is provided with a thickness of approximately 15 μm. It should be noted that substrate holder 11 and base substrate 1 placed on substrate holder 11 rotate in the step (S13).

In the step (S13), in the source material gas used to form silicon carbide epitaxial layer 2, a ratio (C/Si ratio) of the number of C atoms to the number of Si atoms is not less than 1.0 and not more than 1.2. This is due to the following reason. That is, when a source material gas having a C/Si ratio of more than 1.2 is used, silicon carbide epitaxial layer 2 to be formed will have crystal defects such as triangle defect and step bunching. On the other hand, when a source material gas having a C/Si ratio of less than 1.0 is used, silicon carbide epitaxial layer 2 to be formed will be likely to have crystal defects such as triangle defect.

The following describes function and effect of silicon carbide epitaxial substrate 10 according to the present embodiment.

Even though silicon carbide epitaxial substrate 10 according to the present embodiment has a large outer diameter such as 100 mm or more, silicon carbide epitaxial substrate 10 has good surface quality, is controlled to have a low background concentration of nitrogen, and has high in-plane uniformity thereof. Accordingly, by manufacturing silicon carbide semiconductor device 30 using silicon carbide epitaxial substrate 10 according to the present embodiment, fluctuation in property can be suppressed, and a silicon carbide semiconductor device 30 particularly suitable for a device required to have a high breakdown voltage can be obtained with high efficiency.

Figure 5:
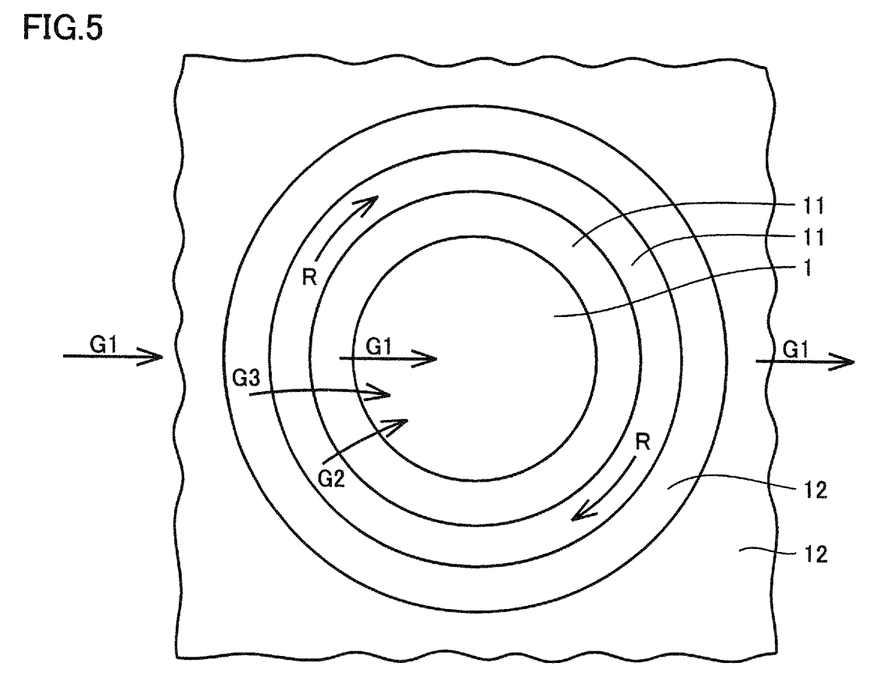
FIG. 5 is a plan view showing a configuration around a substrate holder in the silicon carbide growth device according to the first embodiment.

Referring to FIG. 5 and FIG. 6, the following describes function and effect of the method of manufacturing the silicon carbide epitaxial substrate, silicon carbide growth device 100, and silicon carbide growth device members 11, 12 in the present embodiment.

In the step (S13) of forming silicon carbide epitaxial layer 2 on first main surface 1A of base substrate 1, base substrate 1 placed on substrate holder 11 rotates in silicon carbide growth device 100 (rotates in a direction of arrows R in FIG. 5). Hence, while performing the step (S13), an outer circumferential region of base substrate 1 is located adjacent to the members such as substrate holder 11 and heat generator 12 relative to an inner region thereof and is located at the upstream side in distribution direction G1 of the source material gas. In other words, nitrogen emitted from the members included in silicon carbide growth device 100 is supplied to the inner region of base substrate 1 via the outer circumferential region thereof.

Accordingly, if the step (S13) is performed using the conventional silicon carbide growth device under the epitaxial growth conditions allowing for formation of silicon carbide epitaxial layer 2 having good surface quality, silicon carbide epitaxial layer 2 is likely to capture nitrogen therein. Accordingly, most of the nitrogen supplied to the outer circumferential region of base substrate 1 (or silicon carbide epitaxial substrate 10) is captured in the outer circumferential region of silicon carbide epitaxial layer 2, thereby causing a difference in nitrogen concentration from the inner region thereof. This leads to deterioration of the in-plane uniformity of the nitrogen concentration in silicon carbide epitaxial substrate 10. This tendency is particularly noticeable when the flow rate of the dopant gas is reduced. Further, as the diameter of the substrate becomes larger, the in-plane uniformity of the nitrogen concentration in epitaxial substrate 10 becomes deteriorated.

To address this, in substrate holder 11 and heat generator 12 each serving as the silicon carbide growth device member according to the present embodiment, each of substrate holder body 11a, holder coating portion 11b, heat generator body 12a, and heat generator coating portion 12b has a nitrogen concentration of 10 ppm or less. As a result, an amount of nitrogen gas G2 emitted from substrate holder 11 and an amount of nitrogen gas G3 emitted from heat generator 12 are reduced sufficiently to cause no problem in silicon carbide epitaxial substrate 10. In other words, the respective amounts of nitrogen gas G2a emitted from substrate holder body 11a, nitrogen gas G2b emitted from holder coating portion 11b, nitrogen gas G3a emitted from heat generator body 12a, and nitrogen gas G3b emitted from heat generator coating portion 12b are sufficiently reduced.

Hence, by using silicon carbide growth device 100 including substrate holder 11 and heat generator 12 in the present embodiment, the step (S13) of forming silicon carbide epitaxial layer 2 can be performed under the condition that the background concentration of nitrogen has been reduced. As a result, even under the epitaxial growth conditions allowing for good surface quality in silicon carbide epitaxial layer 2, silicon carbide epitaxial layer 2 having high in-plane uniformity of nitrogen concentration can be formed. Thus, silicon carbide epitaxial substrate 10 can be manufactured which includes silicon carbide epitaxial layer 2 having good surface quality and high in-plane uniformity of nitrogen concentration.

In silicon carbide epitaxial substrate 10 according to the present embodiment, silicon carbide epitaxial layer 2 has a nitrogen concentration of approximately not less than $1 \times 10^{15}$ $cm^{-3}$ and not more than $2 \times 10^{16}$ $cm^{-3}$, but the present invention is not limited to this. Silicon carbide epitaxial layer 2 may have a nitrogen concentration of approximately not more than $1.0 \times 10^{15}$ $cm^{-3}$, preferably, not more than $5.0 \times 10^{14}$ $cm^{-3}$, for example. In other words, silicon carbide epitaxial layer 2 may be formed without letting a dopant gas flow. With this, the nitrogen concentration of silicon carbide epitaxial layer 2 becomes approximately as large as the background concentration, but also in this case, there can be exhibited function and effect similar to those of the method of manufacturing the silicon carbide epitaxial substrate according to the present embodiment.

In the method of manufacturing the silicon carbide epitaxial substrate according to the present embodiment, a plurality of silicon carbide epitaxial layers having impurity concentrations or the like different from that of silicon carbide epitaxial layer 2 may be formed in a manner continuous to the step (S13) by changing the flow rate or partial pressure of the source material gas after the step (12) of placing base substrate 1 in silicon carbide growth device 100 and before or after the step (S13) of forming silicon carbide epitaxial layer 2. With this, there can be also exhibited function and effect similar to those of the method of manufacturing the silicon carbide epitaxial substrate according to the present embodiment.

It should be noted that in the method of manufacturing the silicon carbide epitaxial substrate according to the present embodiment, ammonia is used as the dopant gas in the step (S13) of forming silicon carbide epitaxial layer 2, but the present invention is not limited to this. For example, nitrogen ($N_2$) may be used. In this case, by appropriately controlling the flow rate or the like of $N_2$, there can be exhibited function and effect similar to those of the method of manufacturing the silicon carbide epitaxial substrate according to the present embodiment. It should be noted that also when $N_2$ gas is employed as the dopant gas, it is preferable to supply the $N_2$ gas to CVD device 100 after letting the $N_2$ gas flow through preheating structure 17 (see FIG. 11). In this way, the $N_2$ gas can be sufficiently thermally decomposed before supplying it onto base substrate 1. The heating temperature in preheating structure 17 may be any temperature as long as the nitrogen gas can be sufficiently thermally decomposed at that temperature. For example, the heating temperature may be approximately 1600° C.

(Second Embodiment)

Figure 7:
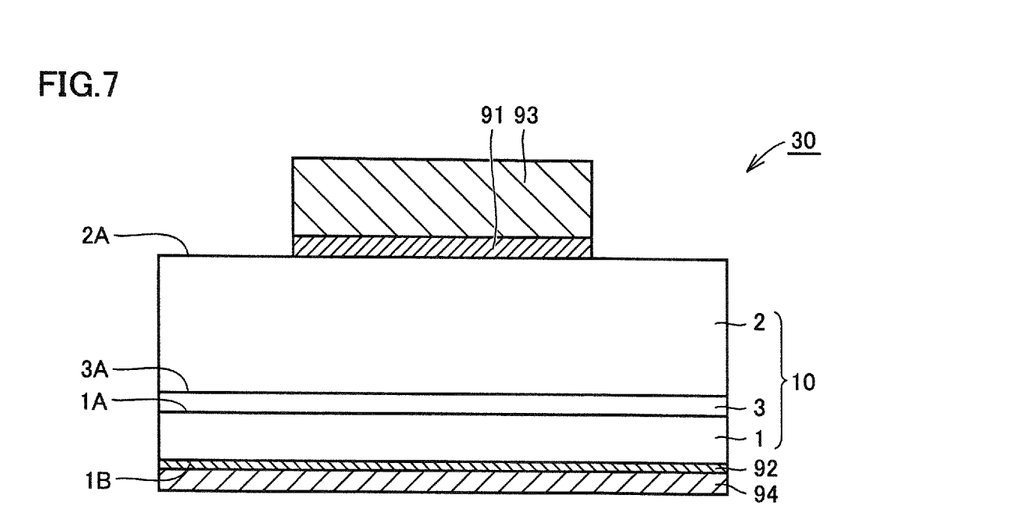
FIG. 7 is a cross sectional view for illustrating a silicon carbide semiconductor device according to a second embodiment.
Figure 8:
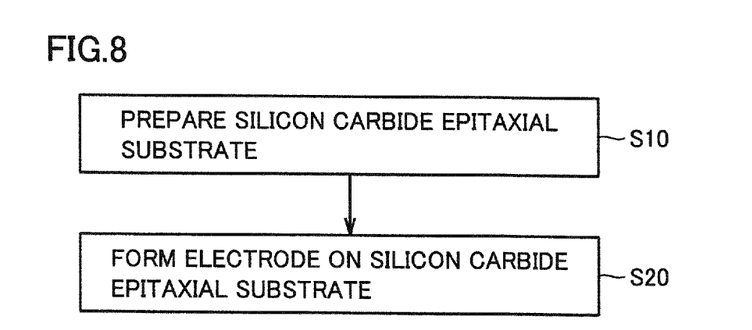
FIG. 8 is a flowchart of a method of manufacturing the silicon carbide semiconductor device according to the second embodiment.

The following describes another embodiment, i.e., a second embodiment of the present invention with reference to FIG. 7 and FIG. 8. A silicon carbide semiconductor device according to the second embodiment is a silicon carbide semiconductor device manufactured using silicon carbide epitaxial substrate 10 according to the first embodiment. A method of manufacturing the silicon carbide semiconductor device according to the second embodiment is a method of manufacturing a silicon carbide semiconductor device 30 using silicon carbide epitaxial substrate 10 according to the first embodiment. Specifically, the method of manufacturing the silicon carbide semiconductor device according to the present embodiment is configured in the same manner as the method of manufacturing the silicon carbide epitaxial substrate according to the first embodiment, and is different therefrom in that the method of manufacturing the silicon carbide semiconductor device according to the present embodiment further includes a step (S20) of forming electrodes 91, 92 on silicon carbide epitaxial substrate 10.

Silicon carbide semiconductor device 30 according to the present embodiment is configured as a Schottky barrier diode (SBD: Schottky Barrier Diode), for example. Referring to FIG. 7, SBD 30 mainly includes a silicon carbide epitaxial substrate 10, a Schottky electrode 91, an ohmic electrode 92, an interconnection 93, and a pad electrode 94.

Silicon carbide epitaxial substrate 10 is silicon carbide epitaxial substrate 10 according to the first embodiment, and includes: a base substrate 1; an n+ silicon carbide epitaxial layer 3 formed on first main surface 1A of base substrate 1; and an n− silicon carbide epitaxial layer 2 formed on a fourth main surface 3A of n+ silicon carbide epitaxial layer 3. N+ silicon carbide epitaxial layer 3 has a carrier concentration of approximately $2.0 \times 10^{18}$ $cm^{-3}$, and n− silicon carbide epitaxial layer 2 has a carrier concentration of approximately $5.0 \times 10^{15}$ $cm^{-3}$.

Schottky electrode 91 is formed on and in Schottky junction with second main surface 2A of silicon carbide epitaxial substrate 10. Schottky electrode 91 is made of a material capable of being in Schottky junction with silicon carbide epitaxial substrate 10. For example, at least one metal selected from a group consisting of titanium (Ti), tungsten (W), molybdenum (Mo), nickel (Ni), tantalum (Ta), and gold (Au) can be employed. Interconnection 93 is made of a conductor such as Al and is formed on Schottky electrode 91.

Ohmic electrode 92 is formed on and in contact with third main surface 1B of silicon carbide epitaxial substrate 10 opposite to the Schottky electrode 91 side. Ohmic electrode 92 is formed of a TiAlSi alloy, a NiSi alloy, or the like, and is in ohmic junction with silicon carbide epitaxial substrate 10. Pad electrode 94 is formed of a conductor such as Al, and is formed on ohmic electrode 92.

The following describes a method of manufacturing the silicon carbide semiconductor device according to the present embodiment. The method of manufacturing the silicon carbide semiconductor device according to the present embodiment includes: the step (S10) of preparing silicon carbide epitaxial substrate 10; and the step (S20) of forming electrodes 91, 92 on silicon carbide epitaxial substrate 10.

The step (S10) of preparing silicon carbide epitaxial substrate 10 is performed in accordance with the method of manufacturing the silicon carbide epitaxial substrate in the first embodiment. In this way, silicon carbide epitaxial substrate 10 is prepared which includes silicon carbide epitaxial layer 2 having good surface quality and high in-plane uniformity of nitrogen concentration. In doing so, in the step (S13) of forming silicon carbide epitaxial layer 2 on base substrate 1, n+ silicon carbide epitaxial layer 3 and n− silicon carbide epitaxial layer 2 may be epitaxially grown in a continuous manner. Specifically, first, by supplying base substrate 1 with the source material gas used to form silicon carbide epitaxial layer 2 and heating base substrate 1 to the epitaxial growth temperature in CVD device 100, n+ silicon carbide epitaxial layer 3 is formed on first main surface 1A of base substrate 1. Next, with base substrate 1 on substrate holder 11 being kept in CVD device 100, the flow rate or partial pressure of the source material gas may be changed to form n− silicon carbide epitaxial layer 2 on fourth main surface 3A of n+ silicon carbide epitaxial layer 3.

Next, electrodes 91, 92 are formed on silicon carbide epitaxial substrate 10 (step (S20)). Specifically, Schottky electrode 91 and ohmic electrode 92 are formed respectively on second main surface 2A and third main surface 1B of silicon carbide epitaxial substrate 10, third main surface 1B being opposite to first main surface 1A. Electrodes 91, 92 are formed using a deposition method, for example. Further, interconnection 93 is formed on Schottky electrode 91 and pad electrode 94 is formed on ohmic electrode 92. In this way, SBD 30 according to the present embodiment is manufactured.

The following describes function and effect of silicon carbide semiconductor device 30 and the method of manufacturing the silicon carbide semiconductor device in the present embodiment.

The silicon carbide semiconductor device according to the present embodiment is manufactured using silicon carbide epitaxial substrate 10 according to the first embodiment including silicon carbide epitaxial layer 2 that has good surface quality and that has high in-plane uniformity of nitrogen concentration. Therefore, according to the method of manufacturing the silicon carbide semiconductor device according to the present embodiment, occurrence of surface abnormality can be suppressed and fluctuation in property can be suppressed to be small, whereby silicon carbide semiconductor device 30 having designed properties can be manufactured at a high yield.

Example 1

The following describes an example of the present invention.

1. Evaluation Samples (i) Example Sample 1

First, a base substrate made of silicon carbide and having an outer diameter of 150 mm and a thickness of 350 μm was prepared.

Next, the silicon carbide growth device according to the present embodiment was used to form, on the first main surface of the base substrate, a silicon carbide epitaxial layer having an impurity concentration of $1.0 \times 10^{15}$ cm$^{-3}$ and a thickness of 15 μm. For the substrate holder of the silicon carbide growth device, there was employed a substrate holder including: a substrate holder body having a nitrogen concentration of 2 ppm; and a holder coating portion having a nitrogen concentration of 0.4 ppm. For the heat generator, there was employed a heat generator including: a heat generator body having a nitrogen concentration of 2 ppm; and a heat generator coating portion having a nitrogen concentration of 0.4 ppm. Introduced into the reaction chamber of the CVD device on this occasion were: a carrier gas including $H_2$; and a source material gas including 46 sccm of $SiH_4$, 18.5 sccm of $C_3H_8$, and not less than 0.01 sccm and not more than 0.05 sccm of $NH_3$. The introduction was performed under the condition that the C/Si ratio was 1.0. A pressure in the growth chamber was set to be not less than $8 \times 10^3$ Pa and not more than $12 \times 10^3$ Pa. A growth temperature was set at 1620° C.

(ii) Example Sample 2

An example sample 2 was configured basically the same as example sample 1 described above, and was fabricated under similar conditions. However, example sample 2 was different from example sample 1 in the following points: the source material gas used to form the silicon carbide epitaxial layer was introduced under the condition that the C/Si ratio was 1.1; and the growth temperature was set at 1600° C.

(iii) Example Sample 3

An example sample 3 was configured basically the same as example sample 1 described above, and was fabricated under similar conditions. However, example sample 3 was different from example sample 1 in the following points: the source material gas used to form the silicon carbide epitaxial layer was introduced under the condition that the C/Si ratio was 1.2; and the growth temperature was set at 1530° C.

(iv) Example Sample 4

An example sample 4 was configured basically the same as example sample 1 described above, and was fabricated under similar conditions. However, example sample 4 was different from example sample 1 in the following points: the source material gas used to form the silicon carbide epitaxial layer was introduced under the condition that the C/Si ratio was 1.2; and the growth temperature was set at 1540° C.

(v) Example Sample 5

An example sample 5 was configured basically the same as example sample 1 described above, and was fabricated under similar conditions. However, example sample 5 was different from example sample 1 in the following points: the source material gas used to form the silicon carbide epitaxial layer was introduced under the condition that the C/Si ratio was 1.2; and the growth temperature was set at 1550° C.

(vi) Comparative Example Sample 1

First, a base substrate made of silicon carbide and having an outer diameter of 150 mm and a thickness of 350 μm was prepared.

Next, the conventional silicon carbide growth device was used to form, on the first main surface of the base substrate, a silicon carbide epitaxial layer having an impurity concentration of $1.0 \times 10^{15}$ cm$^{-3}$ and a thickness of 15 p.m. In the conventional silicon carbide growth device, the substrate holder body had a nitrogen concentration of 10 ppm, the holder coating portion had a nitrogen concentration of 900 ppm, the heat generator body had a nitrogen concentration of 30 ppm, and the heat generator coating portion had a nitrogen concentration of 2%. Introduced into the reaction chamber of the CVD device on this occasion were: a carrier gas including $H_2$; and a source material gas including 46 sccm of $SiH_4$, 18.5 sccm of $C_3H_8$, and not less than 0.01 sccm and not more than 0.05 sccm of $NH_3$. The introduction was performed under the condition that the C/Si ratio was 1.2. A pressure in the growth chamber was set at not less than $8 \times 10^3$ Pa and not more than $12 \times 10^3$ Pa, and a growth temperature was set at 1540° C. In other words, comparative example sample 1 was grown under the same growth condition as example sample 3, except that the nitrogen concentration in the silicon carbide growth device member was not low.

(vii) Comparative Example Sample 2

A comparative example sample 2 was configured basically the same as comparative example sample 1 described above, and was fabricated under similar conditions. Comparative example 2 was, however, different therefrom in that the growth temperature was set at 1550° C. In other words, comparative example sample 2 was grown under the same growth condition as example sample 4, except that the nitrogen concentration of the silicon carbide growth device member was not low.

2. Experiment (2-1) Surface Quality

The surfaces of the example samples and comparative example samples obtained as described above were observed using a differential interference microscope. Specifically, a 10× magnification objective lens and a 10× magnification ocular lens were used to observe the surface (second main surface) of each silicon carbide epitaxial substrate.

Further, an AFM was used to measure a surface roughness (Ra) of the surface (second main surface) of the silicon carbide epitaxial substrate of each of the example samples and comparative example samples.

(2-2) In-Plane Uniformity of Nitrogen Concentration

A mercury probe device was used to perform C-V measurement onto the example samples and comparative example samples obtained as described above, so as to calculate a carrier concentration. Specifically, the C-V measurement was performed at an interval of 10 mm from the center of the silicon carbide epitaxial substrate in the radial direction. From the result of measurement, average value and standard deviation in the plane of the silicon carbide epitaxial substrate were calculated and a ratio ($\sigma$/Ave.) of the standard deviation to the average value was found.

3. Result (3-1) Surface Quality

No triangle defect and step bunching were confirmed in the surface (second main surface) of the silicon carbide epitaxial substrate of each of example samples 1 to 5 and comparative examples 1 and 2, so that each of them had good surface quality. The surface roughness (Ra) on this occasion was approximately not less than 0.2 nm and not more than 0.3 nm.

(3-2) In-Plane Uniformity of Nitrogen Concentration

The ratio ($\sigma$/Ave.) of the nitrogen concentration in the surface (second main surface) of the silicon carbide epitaxial substrate of each of example samples 1 to 5 was 15% or less. In the case of the silicon carbide epitaxial substrate of example sample 5, the ratio was 7% or less. In the case of the silicon carbide epitaxial substrate of each of example samples 3 and 4, the ratio was 5% or less. As such, it was confirmed that the nitrogen concentration was extremely uniform. On the other hand, the ratio ($\sigma$/Ave.) of the nitrogen concentration in the surface (second main surface) of the silicon carbide epitaxial substrate was 20% and 30% in the case of comparative example samples 1 and 2, each of which was obtained under the same epitaxial growth conditions as those of example samples 3 and 4 except that the nitrogen concentration of the silicon carbide growth device member was not low. In other words, it was confirmed that when the nitrogen concentration in the silicon carbide growth device member is 10 ppm or less, a silicon carbide epitaxial substrate having high in-plane uniformity of nitrogen concentration in its second main surface can be manufactured even under the growth conditions which would have been likely to cause capturing of nitrogen to result in decreased in-plane uniformity of nitrogen concentration in the second main surface if the conventional silicon carbide growth device member were used.

Although the embodiments and examples of the present invention have been illustrated, the embodiments and examples described above can be modified in various manners. Further, the scope of the present invention is not limited to the above-described embodiments and examples. The scope of the present invention is defined by the terms of the claims, and is intended to include any modifications within the scope and meaning equivalent to the terms of the claims.

The present invention is particularly advantageously applied to a silicon carbide semiconductor device required to have a high breakdown voltage.

Embodiments of the present invention regarding a silicon carbide growth device, a silicon carbide growth device member, and a method of manufacturing a silicon carbide semiconductor device are summarized as follows.

A silicon carbide growth device comprising a member that is exposed to a source material gas used to epitaxially grow silicon carbide and that is heated to an epitaxial growth temperature, said member having a nitrogen concentration of 10 ppm or less.

A silicon carbide growth device member, wherein in a silicon carbide growth device, the silicon carbide growth device member is a member that is exposed to a source material gas used to epitaxially grow silicon carbide and that is heated to an epitaxial growth temperature, and has a nitrogen concentration of 10 ppm or less.

A method of manufacturing a silicon carbide semiconductor device, comprising the steps of:
preparing a silicon carbide epitaxial substrate; and
forming an electrode on said silicon carbide epitaxial substrate,
in the step of preparing said silicon carbide epitaxial substrate, said silicon carbide epitaxial substrate being manufactured using the method of manufacturing the silicon carbide epitaxial substrate according to the present invention.

Heretofore, the embodiments of the present invention have been illustrated, but the embodiments disclosed herein are illustrative and non-restrictive in any respect. The scope of the present invention is defined by the terms of the claims, and is intended to include any modifications within the scope and meaning equivalent to the terms of the claims.

What is claimed is:

1. A method of manufacturing a silicon carbide epitaxial substrate, comprising the steps of:
preparing a base substrate;
placing said base substrate in a silicon carbide growth device; and
forming a silicon carbide epitaxial layer on said base substrate by supplying said base substrate with a source material gas used to form said silicon carbide epitaxial layer and heating said base substrate to an epitaxial growth temperature, said silicon carbide growth device including a member having a coating that is exposed to said source material gas and that is heated to said epitaxial growth temperature, wherein the member includes a substrate holder supporting the base substrate, a heat generator positioned around the substrate holder, and the coating on the substrate holder and the heat generator, wherein a nitrogen concentration of the substrate holder, the heat generator, and the coating is 10 ppm or less.

2. The method of manufacturing the silicon carbide epitaxial substrate according to claim 1, wherein in the step of forming said silicon carbide epitaxial layer, said source material gas includes ammonia gas as a dopant gas.

3. The method of manufacturing the silicon carbide epitaxial substrate according to claim 1, wherein said base substrate prepared in the step of preparing said base substrate has an outer diameter of 100 mm or more.

4. The method of manufacturing the silicon carbide epitaxial substrate according to claim 1, wherein the coating encompasses the substrate holder.

5. The method of manufacturing the silicon carbide epitaxial substrate according to claim 1, wherein the coating covers the surface of the heat generator that is exposed to said source material gas.

6. The method of manufacturing the silicon carbide epitaxial substrate according to claim 1, wherein the coating covers the surface of the member that is exposed to said source material gas.

* * * * *